(12) United States Patent
Asari et al.

(10) Patent No.: US 10,501,842 B2
(45) Date of Patent: *Dec. 10, 2019

(54) COATED TOOL

(71) Applicant: TUNGALOY CORPORATION, Iwaki-shi, Fukushima (JP)

(72) Inventors: Shota Asari, Iwaki (JP); Masakazu Kikuchi, Iwaki (JP)

(73) Assignee: TUNGALOY CORPORATION, Fukushima (JP)

( * ) Notice: Subject to any disclaimer, the term of this patent is extended or adjusted under 35 U.S.C. 154(b) by 170 days.

This patent is subject to a terminal disclaimer.

(21) Appl. No.: 15/697,026

(22) Filed: Sep. 6, 2017

(65) Prior Publication Data

US 2018/0010233 A1 Jan. 11, 2018

Related U.S. Application Data

(62) Division of application No. 14/420,300, filed as application No. PCT/JP2013/071753 on Aug. 12, 2013, now abandoned.

(30) Foreign Application Priority Data

Aug. 10, 2012 (JP) ................................ 2012-177843
Aug. 24, 2012 (JP) ................................ 2012-185370

(51) Int. Cl.
C23C 28/04 (2006.01)
C23C 30/00 (2006.01)
(Continued)

(52) U.S. Cl.
CPC .......... C23C 14/0641 (2013.01); C23C 14/32 (2013.01); C23C 14/325 (2013.01);
(Continued)

(58) Field of Classification Search
CPC .............................. C23C 28/42; C23C 28/044
See application file for complete search history.

(56) References Cited

U.S. PATENT DOCUMENTS

| 6,077,596 A | 6/2000 | Hashimoto et al. |
| 7,470,296 B2 | 12/2008 | Lindholm et al. |

(Continued)

FOREIGN PATENT DOCUMENTS

| JP | H07-205361 A | 8/1995 |
| JP | 2003-200306 A | 7/2003 |

(Continued)

OTHER PUBLICATIONS

International Search Report in PCT/JP2013/071753, dated Sep. 17, 2013.

(Continued)

*Primary Examiner* — Laura A Auer
(74) *Attorney, Agent, or Firm* — Foley & Lardner LLP

(57) ABSTRACT

A coated tool includes a substrate and a coating layer disposed on a surface of the substrate. The coating layer includes a first stack structure (3) and a second stack structure (4). The first stack structure has two or more kinds of layers with different compositions periodically stacked with an average layer thickness of 60-500 nm. The second stack structure has two or more kinds of layers with different compositions periodically stacked with an average layer thickness of 2 nm to less than 60 nm. The layers in each stack structure include at least one selected from the group consisting of metal elements Ti, Zr, Hf, V, Nb, Ta, Cr, Mo, W, Al, Si, Sr, Y, Sn and Bi; and compounds including at least one of these metal elements and at least one non-metal element selected from carbon, nitrogen, oxygen and boron.

10 Claims, 1 Drawing Sheet

(51) Int. Cl.
    *C23C 14/06* (2006.01)
    *C23C 14/32* (2006.01)
    *C23C 28/00* (2006.01)

(52) U.S. Cl.
    CPC .......... *C23C 28/042* (2013.01); *C23C 28/044* (2013.01); *C23C 28/42* (2013.01); *C23C 30/005* (2013.01); *Y10T 428/24975* (2015.01)

(56) References Cited

U.S. PATENT DOCUMENTS

| | | |
|---|---|---|
| 2002/0176755 A1 | 11/2002 | Ruppi |
| 2009/0155559 A1 | 6/2009 | Xu et al. |
| 2010/0215951 A1 | 8/2010 | Shibata et al. |
| 2011/0171444 A1* | 7/2011 | Elkouby ............... C23C 14/024 428/216 |
| 2011/0182682 A1 | 7/2011 | Abukawa et al. |

FOREIGN PATENT DOCUMENTS

| | | |
|---|---|---|
| JP | 2010-099769 A | 5/2010 |
| JP | 2010-207916 A | 9/2010 |
| JP | 2011-104722 A | 6/2011 |
| JP | 2012-035379 A | 2/2012 |
| WO | WO-9410351 A1 | 5/1994 |
| WO | WO-2011099683 A1 * | 8/2011 ........... C23C 28/044 |

OTHER PUBLICATIONS

Restriction Requirement issued in U.S. Appl. No. 14/420,300 dated Jul. 21, 2016.

Non-Final Office Action issued in U.S. Appl. No. 14/420,300 dated Feb. 8, 2017.

Final Office Action issued in U.S. Appl. No. 14/420,300 dated Jun. 9, 2017.

* cited by examiner

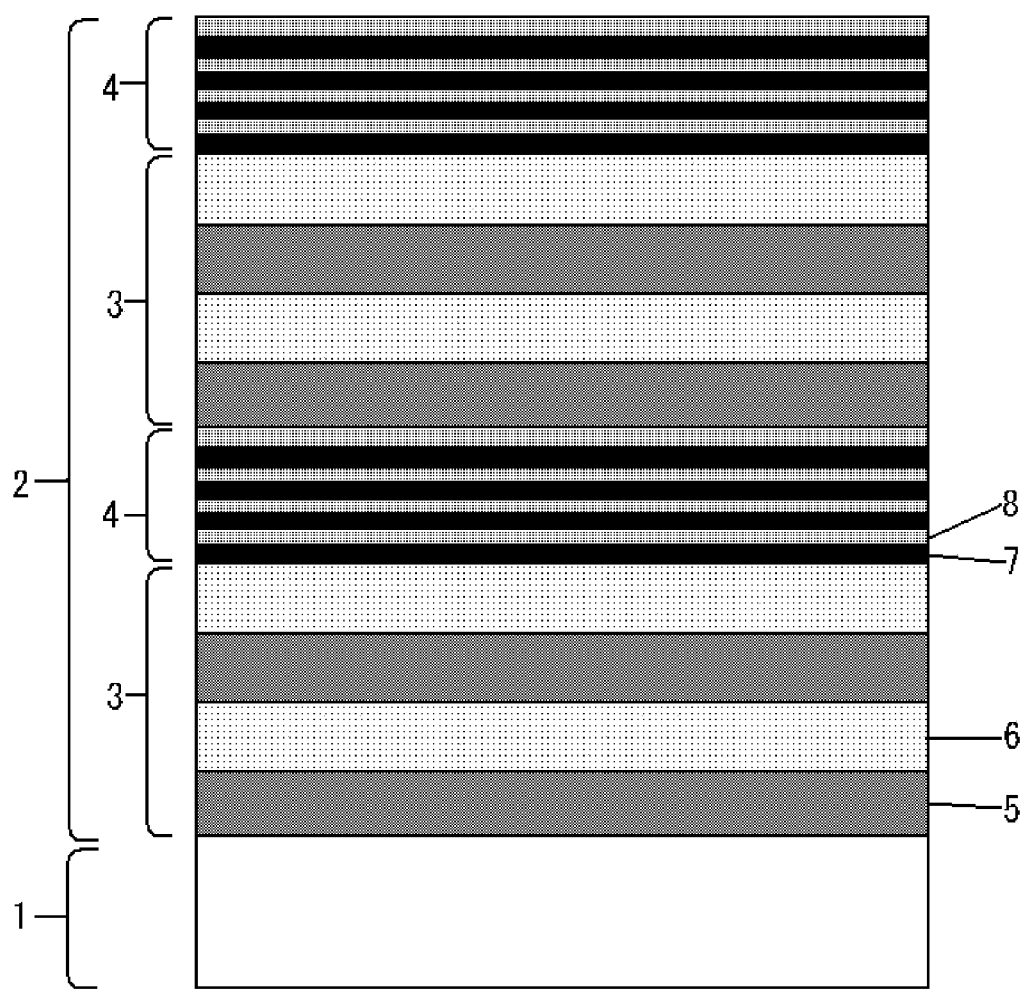

COATED TOOL

CROSS-REFERENCE TO RELATED APPLICATIONS

The present application is a divisional of U.S. patent application Ser. No. 14/420,300, filed on Feb. 6, 2015, which is a National Stage of International Application No. PCT/JP2013/071753, filed on Aug. 12, 2013, which claims the benefit of priority to Japanese Patent Application No. 2012-177843, filed on Aug. 10, 2012, and Japanese Patent Application No. 2012-185370, filed on Aug. 24, 2012, the entire contents of which are hereby incorporated by reference.

TECHNICAL FIELD

The present invention relates to coated tools.

BACKGROUND ART

With a recent increase in the demands for enhanced efficiencies in cutting, there has been a need for a longer life of cutting tools than heretofore available. Consequently, the requirement on the properties of tool materials which has become ever more important is that wear resistance and fracture resistance associated with the life of cutting tools be enhanced. In order to obtain enhancements in these properties, coated tools are used in which an alternate film stack of coating films is disposed on a substrate.

Various techniques have been proposed to improve properties of such alternate film stacks. For example, Patent Literature 1 proposes a highly wear resistant cutting tool in which a specific metal element or a compound thereof and a specific alloy compound are stacked with a stacking period of 0.4 nm to 50 nm on the surface of a base material.

Patent Literature 2 proposes a cutting tool exhibiting excellent wear resistance even under heavy cutting conditions. This tool is such that the surface of a base is coated with 4 or more layers having an average total layer thickness of 2 to 10 μm which are in the form of an alternate stack of first thin layers of a composite nitride represented by the composition formula $(Ti_{1-x}Al_x)N$ (x in atomic ratio: 0.30 to 0.70) and second thin layers containing an aluminum oxide phase in a ratio of 35 to 65 mass % relative to the total of the mass thereof and the mass of a titanium nitride phase, the average layer thickness of the individual layers being 0.2 to 1 μm.

Patent Literature 3 proposes a cutting tool with excellent wear resistance and welding resistance which is such that 100-5000 nm stack layers including a periodic stack of layers with thicknesses of 1 to 50 nm, and 100-5000 nm single layers are alternately stacked in 10 or more layers on top of one another on a hard base material.

PRIOR ART REFERENCES

Patent Literatures

Patent Literature 1: Japanese Patent Application Kokai Publication No. H07-205361
Patent Literature 2: Japanese Patent Application Kokai Publication No. 2003-200306
Patent Literature 3: Japanese Patent Application Kokai Publication No. H11-12718

SUMMARY OF THE INVENTION

Problems to be Solved by the Invention

In recent cutting, tools are subjected to more marked increases in speed, feed and cut-in depth. Consequently, it is more frequently the case that cracks that have occurred on the surface of tools due to the load applied to the cutting edges during the cutting reach the substrates, or cracks that have occurred in the substrates due to sharp changes in the temperature of the cutting edges penetrate into the coating layers, resulting in the fracture of the tools.

Although the cutting tool of the invention of Patent Literature 1 which includes a stack of thin layers with a stacking period of 0.4 to 50 nm exhibits high wear resistance, the tool is problematically prone to be fractured under the circumstances described above. The cutting tool of the invention of Patent Literature 2 which includes an alternate stack of layers with a large individual average layer thickness has a problem in that the hardness of the coating films is so insufficient that the tool exhibits poor wear resistance. In the cutting tool of the invention of Patent Literature 3 which has a stacked structure formed of stack layers of thin films and single layers, the fracture resistance is insufficient and the tool cannot more often satisfy the required performance described hereinabove.

The present invention has been made to solve these problems. It is therefore an object of the invention to provide long-life coated tools which are enhanced in fracture resistance without any decrease in wear resistance.

Means to Solve the Problems

The present inventors carried out studies on the extension of the life of coated tools. The present inventors have then found that fracture resistance may be enhanced without causing a decrease in wear resistance by improving the layer configurations and the compositions of coating layers. As a result, the extension of the life of coated tools has been realized.

Specifically, the present invention may be summarized as follows.

(1) A coated tool comprising a substrate and a coating layer disposed on a surface of the substrate, the coating layer including a first stack structure and a second stack structure, the first stack structure having a structure in which two or more kinds of layers with different compositions are periodically stacked wherein the average layer thickness of each of the layers is 60 nm to 500 nm, the second stack structure having a structure in which two or more kinds of layers with different compositions are periodically stacked wherein the average layer thickness of each of the layers is 2 nm to less than 60 nm, the layers constituting the first stack structure and the layers constituting the second stack structure including at least one selected from the group consisting of a metal including at least one metal element selected from Ti, Zr, Hf, V, Nb, Ta, Cr, Mo, W, Al, Si, Sr, Y, Sn and Bi; and compounds including at least one of these metal elements and at least one non-metal element selected from carbon, nitrogen, oxygen and boron.

(2) The coated tool of (1), wherein the first stack structure is an alternate stack structure including two kinds of layers with different compositions stacked alternately each in two or more layers.

(3) The coated tool of (1) or (2), wherein the second stack structure is an alternate stack structure including two kinds of layers with different compositions stacked alternately each in two or more layers.

(4) The coated tool of any of (1) to (3), wherein the coating layer includes a structure including the first stack structures and the second stack structures stacked alternately and continuously each in two or more layers.

(5) The coated tool of any of (1) to (4), wherein ($T_1$-$T_2$) is 20 nm to 996 nm wherein $T_1$ is the average value of the stacking periods in the first stack structure and $T_2$ is the average value of the stacking periods in the second stack structure.

(6) The coated tool of any of (1) to (5), wherein the layers constituting the first stack structure and the layers constituting the second stack structure each include at least one selected from the group consisting of metals including at least two metal elements selected from Ti, Nb, Ta, Cr, W, Al, Si, Sr and Y; and compounds including at least two of these metal elements and at least one non-metal element selected from carbon, nitrogen, oxygen and boron.

(7) The coated tool of any of (1) to (6), wherein the metal elements present in the layers constituting the first stack structure are identical among the layers constituting the first stack structure and include one or more metal elements having a difference in absolute value of 5 at % or more between the ratio thereof relative to the total of the metal elements present in one layer constituting the first stack structure and the ratio of the identical metal element relative to the total of the metal elements present in a layer constituting the first stack structure which layer is adjacent to the one layer.

(8) The coated tool of any of (1) to (7), wherein the metal elements present in the layers constituting the second stack structure are identical among the layers constituting the second stack structure and include one or more metal elements having a difference in absolute value of 5 at % or more between the ratio thereof relative to the total of the metal elements present in one layer constituting the second stack structure and the ratio of the identical metal element relative to the total of the metal elements present in a layer constituting the second stack structure which layer is adjacent to the one layer.

(9) The coated tool of any of (1) to (6), wherein one layer constituting the first stack structure contains one or more metal elements different from the metal element or elements present in a layer constituting the first stack structure which layer is adjacent to the one layer.

(10) The coated tool of any of (1) to (6) and (9), wherein one layer constituting the second stack structure contains one or more metal elements different from the metal element or elements present in a layer constituting the second stack structure which layer is adjacent to the one layer.

(11) The coated tool of any of (1) to (10), wherein the average total layer thickness of the entirety of the coating layer is 0.22 to 12 μm.

(12) The coated tool of any of (1) to (11), wherein the average thickness of the first stack structure is 0.2 to 6 μm.

(13) The coated tool of any of (1) to (12), wherein the average thickness of the second stack structure is 0.02 to 6 μm.

Effects of the Invention

The coated tools of the present invention have excellent wear resistance and fracture resistance to achieve a longer tool life than heretofore possible.

BRIEF DESCRIPTION OF DRAWING

FIG. 1 is an example of schematic views illustrating a sectional structure of a coated tool of the present invention.

DESCRIPTION OF EMBODIMENTS

A coated tool of the present invention includes a substrate and a coating layer disposed on a surface of the substrate. The substrates in the present invention are not particularly limited, and any substrates of coated tools may be used. Examples thereof include cemented carbides, cermets, ceramics, sintered cubic boron nitrides, sintered diamonds and high-speed steels. In particular, cemented carbide substrates are more preferable due to excellent wear resistance and fracture resistance.

Wear resistance tends to be decreased if the average total layer thickness of the entirety of the coating layer in the coated tool of the present invention is less than 0.22 μm. A decrease in fracture resistance tends to be caused if the average total layer thickness of the entirety of the coating layer exceeds 12 μm. It is therefore preferable that the average total layer thickness of the entirety of the coating layer be 0.22 to 12 μm. In particular, the average total layer thickness of the entirety of the coating layer is more preferably 1.0 to 8.0 μm.

As described hereinabove, the coating layer in the coated tool of the present invention includes a specific first stack structure and a specific second stack structure. Each of the layers constituting the first stack structure includes at least one selected from the group consisting of:

a metal including at least one metal element selected from Ti, Zr, Hf, V, Nb, Ta, Cr, Mo, W, Al, Si, Sr, Y, Sn and Bi; and compounds including at least one of these metal elements and at least one non-metal element selected from carbon, nitrogen, oxygen and boron. Such layers exhibit excellent wear resistance.

In particular, it is more preferable that the layers constituting the first stack structure include at least one selected from the group consisting of:

metals including at least two metal elements selected from Ti, Nb, Ta, Cr, W, Al, Si, Sr and Y; and compounds including at least two of these metal elements and at least one non-metal element selected from carbon, nitrogen, oxygen and boron. This configuration adds hardness. Specific examples of the metals or the compounds for forming the constituent layers in the first stack structure include $(Al_{0.50}Ti_{0.50})N$, $(Al_{0.60}Ti_{0.40})N$, $(Al_{0.67}Ti_{0.33})N$, $(Al_{0.67}Ti_{0.33})CN$, $(Al_{0.45}Ti_{0.45}Si_{0.10})N$, $(Al_{0.45}Ti_{0.45}Y_{0.10})N$, $(Al_{0.50}Ti_{0.30}Cr_{0.20})N$, $(Al_{0.50}Ti_{0.45}Nb_{0.05})N$, $(Al_{0.50}Ti_{0.45}Ta_{0.05})N$, $(Al_{0.50}Ti_{0.45}W_{0.05})N$, $(Ti_{0.90}Si_{0.10})N$ and $(Al_{0.50}Cr_{0.50})N$.

In the coating layer in the coated tool of the present invention, the first stack structure has a structure in which two or more kinds of layers including any of these metals or compounds are periodically stacked on top of one another with each layer having an average layer thickness of 60 nm to 500 nm. This stack structure having a specific periodicity includes two or more kinds of layers with different compositions. To prevent the penetration of cracks and to obtain enhanced fracture resistance, it is preferable that these layers with different compositions be stacked alternately each in two or more layers.

In the invention, the thickness of the minimum unit whose repetition makes up the stack is written as the "stacking period". The stacking period will be explained below with reference to FIG. 1 which is an example of schematic views illustrating a sectional structure of a coated tool of the invention. When, for example, the stack consists of the repetition of Layer A1 (5), Layer B1 (6), Layer C1 and Layer D1 having different compositions in the order of Layer A1→Layer B1→Layer C1→Layer D1→Layer A1→Layer B1→Layer C1→Layer D1→ . . . from the substrate 1 toward the surface of the coating layer 2, the total of the layer thicknesses of Layer A1 to Layer D1 is defined as the "stacking period". In the case where the stack consists of the repetition of Layer A1 (5) and Layer B1 (6) having different compositions in the order of Layer A1→Layer B1→Layer A1→Layer B1→Layer A1→Layer B1→ . . . from the substrate 1 toward the surface of the coating layer 2, the "stacking period" indicates the total of the layer thickness of Layer A1 and the layer thickness of Layer B1.

With the configuration in which the layers having different compositions and respective average layer thicknesses of 60 nm to 500 nm are stacked with the above periodicity, a crack that has occurred in the surface of the coating layer during the use of the coated tool is prevented from penetrating to the substrate. Specifically, such a crack that has reached the first stack structure is caused to advance in a direction parallel to the interface between the layers with different compositions. Advantageously, this effect is further enhanced when an alternate stack structure is adopted in which two kinds of layers having different compositions are stacked alternately each in two or more layers. Specifically, the first stack structure is preferably an alternate stack structure in which Layers A1 and Layers B1 with different compositions are stacked alternately each in two or more layers in the order of Layer A1→Layer B1→Layer A1→Layer B1→ . . . from the substrate toward the surface of the coating layer.

Regarding each of the layers constituting the first stack structure in the coating layer in the coated tool of the present invention, any average layer thickness of each layer that is less than 60 nm results in a decrease in the effect of preventing the penetration of cracks to the substrate. On the other hand, fracture resistance is reduced if the average layer thickness exceeds 500 nm. Thus, the average layer thickness of each of the layers constituting the first stack structure is limited to 60 nm to 500 nm. More preferably, the average layer thickness of each of the layers constituting the first stack structure is 60 nm to 250 nm.

If the average thickness of the first stack structure is less than 0.2 μm, the first stack structure has so small a number of repetitions of the periodic stacking of the layers with different compositions that the first stack structure tends to decrease the effect of suppressing the penetration of cracks to the substrate. On the other hand, any average thickness exceeding 6 μm results in an increase in the residual compressive stress in the entirety of the coating layer, and consequently the coating layer is prone to be separated or fractured, namely, tends to exhibit poor fracture resistance. Thus, the average thickness of the first stack structure in the present invention is more preferably 0.2 to 6 μm.

As described hereinabove, the coating layer in the coated tool of the invention includes a second stack structure. The layers constituting the second stack structure include at least one selected from the group consisting of:
 a metal including at least one metal element selected from Ti, Zr, Hf, V, Nb, Ta, Cr, Mo, W, Al, Si, Sr, Y, Sn and Bi; and
 compounds including at least one of these metal elements and at least one non-metal element selected from carbon, nitrogen, oxygen and boron. Such layers exhibit excellent wear resistance.

In particular, it is more preferable that the layers constituting the second stack structure include at least one selected from the group consisting of:
 metals including at least two metal elements selected from Ti, Nb, Ta, Cr, W, Al, Si, Sr and Y; and
 compounds including at least two of these metal elements and at least one non-metal element selected from carbon, nitrogen, oxygen and boron. This configuration adds hardness. Specific examples of the metals or the compounds for forming the constituent layers in the second stack structure include $(Al_{0.50}Ti_{0.50})N$, $(Al_{0.60}Ti_{0.40})N$, $(Al_{0.67}Ti_{0.33})N$, $(Al_{0.67}Ti_{0.33})CN$, $(Al_{0.45}Ti_{0.45}Si_{0.10})N$, $(Al_{0.45}Ti_{0.45}Y_{0.10})N$, $(Al_{0.50}Ti_{0.30}Cr_{0.20})N$, $(Al_{0.50}Ti_{0.45}Nb_{0.05})N$, $(Al_{0.50}Ti_{0.45}Ta_{0.05})N$, $(Al_{0.50}Ti_{0.45}W_{0.05})N$, $(Ti_{0.90}Si_{0.10})N$ and $(Al_{0.50}Cr_{0.50})N$.

The second stack structure in the present invention has a structure in which two or more kinds of layers including any of these metals or compounds are periodically stacked on top of one another with each layer having an average layer thickness of 2 nm to less than 60 nm. This stack structure having a specific periodicity includes two or more kinds of layers with different compositions. To ensure high hardness and to obtain enhanced wear resistance, it is preferable that the second stack structure be an alternate stack structure in which these layers with different compositions are stacked alternately each in two or more layers.

In the second stack structure, similarly as described above, the thickness of the minimum unit whose repetition makes up the stack is written as the "stacking period". Referring to FIG. 1 as an example, when the stack consists of the repetition of Layer A2 (7), Layer B2 (8), Layer C2 and Layer D2 having different compositions in the order of Layer A2→Layer B2→Layer C2→Layer D2→Layer A2→Layer B2→Layer C2→Layer D2→ . . . from the substrate 1 toward the surface of the coating layer 2, the total of the layer thicknesses of Layer A2 to Layer D2 is defined as the "stacking period". In the case where the stack consists of the repetition of Layer A2 (7) and Layer B2 (8) having different compositions in the order of Layer A2→Layer B2→Layer A2→Layer B2→Layer A2→Layer B2→ . . . from the substrate 1 toward the surface of the coating layer 2, the "stacking period" indicates the total of the layer thickness of Layer A2 and the layer thickness of Layer B2.

With the configuration in which the layers having different compositions and respective average layer thicknesses of 2 nm to less than 60 nm are stacked with the above periodicity, the second stack structure in the coated tool of the present invention attains high hardness to achieve an enhancement in wear resistance. Advantageously, this effect is further enhanced when an alternate stack structure is adopted in which two kinds of layers having different compositions are stacked alternately each in two or more layers. Specifically, the second stack structure is more preferably an alternate stack structure in which Layers A2 and Layers B2 with different compositions are stacked alternately each in two or more layers in the order of Layer A2→Layer B2→Layer A2→Layer B2→ . . . from the substrate toward the surface of the coating layer.

If the average layer thickness of each of the layers constituting the second stack structure is less than 2 nm, a difficulty is encountered in forming the layer with a uniform thickness. If the average layer thickness of each of the layers constituting the second stack structure is 60 nm or more, hardness is reduced to cause a decrease in wear resistance. Further, such a second stack structure has little difference in layer thickness from the first stack structure with the result that it is hard to fully achieve the effect of suppressing the penetration of cracks to the substrate by causing a crack to advance in a direction parallel to the interface between the first stack structure and the second stack structure. Thus, the average layer thickness of each of the layers constituting the second stack structure in the present invention is limited to 2 nm to less than 60 nm. From the above viewpoints, the average layer thickness of each of the layers constituting the second stack structure is more preferably 5 nm to 30 nm.

If the average thickness of the second stack structure is less than 0.02 μm, the second stack structure has so small a number of repetitions of the periodic stacking of the layers that the enhancement in hardness cannot be obtained. On the other hand, any average thickness of the second stack structure exceeding 6 μm results in an increase in the residual compressive stress in the second stack structure, and consequently the coating layer is prone to be separated or fractured, namely, tends to exhibit poor fracture resistance. Thus, the average thickness of the second stack structure is preferably 0.02 to 6 μm.

The coated tool of the present invention preferably has a difference between $T_1$ and $T_2$ ($T_1-T_2$) of 20 to 996 nm wherein $T_1$ is the average value of the stacking periods in the first stack structure and $T_2$ is the average value of the stacking periods in the second stack structure. If the difference ($T_1-T_2$) is less than 20 nm, the coated tool tends to decrease its effect of suppressing the penetration of cracks to the substrate by causing a crack to advance in a direction parallel to the interface between the first stack structure and the second stack structure. If, on the other hand, the difference between $T_1$ and $T_2$ ($T_1-T_2$) exceeds 996 nm, the average thickness of the first stack structure is so large that fracture resistance tends to be decreased. In particular, the difference between $T_1$ and $T_2$ ($T_1-T_2$) is more preferably 20 to 500 nm, and still more preferably 20 to 250 nm.

Provided that the unit "Layer A2→Layer B2" is repeatedly stacked on top of one another 100 times, the average value of the stacking periods is calculated by obtaining the total of the stacking periods of the 100 repeating units "Layer A2→Layer B2→Layer A2→Layer B2→Layer A2→Layer B2→ . . . " and dividing the total of the stacking periods by the number of repetitions, namely, 100.

In a preferred embodiment of the coated tool of the present invention, the metal elements present in the layers constituting the first stack structure are identical among the layers constituting the first stack structure and include one or more metal elements having a difference in absolute value of 5 at % or more between the ratio thereof relative to the total of the metal elements present in one layer constituting the first stack structure and the ratio of the identical metal element relative to the total of the metal elements present in another layer constituting the first stack structure which is adjacent to the one layer.

With this configuration, misalignment of crystal lattices may be obtained at the interface between adjacent layers constituting the first stack structure without causing any decrease in adhesion between the layers. Consequently, the structure may easily cause a crack to advance in a direction parallel to the interface between the layers constituting the first stack structure, and is therefore more advantageous in that the effect of suppressing the penetration of cracks to the substrate is enhanced.

The phrase that the metal elements "include one or more metal elements which have a difference in absolute value of 5 at % or more" will be described. When, for example, the first stack structure includes $(Al_{0.55}Ti_{0.45})N$ layers and $(Al_{0.67}Ti_{0.33})N$ layers, the two kinds of layers include identical metal elements, namely, Al element and Ti element. The ratio of the Al element present in the $(Al_{0.55}Ti_{0.45})N$ layer is 55 at % relative to the total of the metal elements, and the ratio of the Al element present in the $(Al_{0.67}Ti_{0.33})N$ layer is 67 at % relative to the total of the metal elements. Thus, the difference in the ratio of the Al element between the two layers is 12 at %, satisfying the above requirement. Further, $(Al_{0.49}Ti_{0.39}Cr_{0.12})N$ layers and $(Al_{0.56}Ti_{0.36}Cr_{0.08})N$ layers will be discussed. These two kinds of layers include identical metal elements, namely, Al element, Ti element and Cr element. Although the difference in the ratio of the Ti element between the two layers is 3 at % and the difference in the ratio of the Cr element between the two layers is 4 at %, namely, the differences for both elements are less than 5 at %, the structure satisfies the requirement because the difference in the Al ratio between the two layers is 7 at %.

In the present invention, nitrides are sometimes written as $(M_aL_b)N$ with the letter a indicating the atomic ratio of the element M and the letter b indicating the atomic ratio of the element L relative to the total of the metal elements. For example, $(Al_{0.55}Ti_{0.45})N$ means that the atomic ratio of the Al element relative to the total of the metal elements is 0.55 and the atomic ratio of the Ti element relative to the total of the metal elements is 0.45, namely, the ratio of the Al element relative to the total of the metal elements is 55 at % and the ratio of the Ti element relative to the total of the metal elements is 45 at %.

In a preferred embodiment of the coated tool of the present invention, the metal elements present in the layers constituting the second stack structure are identical among the layers constituting the second stack structure and include one or more metal elements having a difference in absolute value of 5 at % or more between the ratio thereof relative to the total of the metal elements present in one layer constituting the second stack structure and the ratio of the identical metal element relative to the total of the metal elements present in another layer constituting the second stack structure which is adjacent to the one layer.

With this configuration, misalignment of crystal lattices may be obtained at the interface between adjacent layers constituting the second stack structure without causing any decrease in adhesion between the layers. Consequently, the structure may easily cause a crack to advance in a direction parallel to the interface between the layers constituting the second stack structure, and is therefore more advantageous in that the effect of suppressing the penetration of cracks to the substrate is enhanced. The meaning of the phrase that the metal elements "include one or more metal elements which have a difference in absolute value of 5 at % or more" is the same as described above with respect to the first stack structure.

In another embodiment of the coated tool of the present invention, it is more preferable that one layer constituting the first stack structure and another layer constituting the first stack structure which is adjacent to the one layer include one or more metal elements different between the layers. With such a configuration, crystal lattices may be misaligned at the interface between the layers and consequently the structure may easily cause a crack to advance in a direction parallel to the interface between the layers, thus achieving an enhancement in the effect of suppressing the penetration of cracks to the substrate. When, for example, the first stack structure includes $(Al_{0.50}Ti_{0.50})N$ layers and $(Al_{0.50}Ti_{0.30}Cr_{0.20})N$ layers, the comparison of the metal elements present in these two kinds of layers shows that the Al element and the Ti element are contained in the two layers while the Cr element is present only in one of the layers. That is, the above requirement is satisfied. Further, when the first stack structure includes $(Al_{0.50}Cr_{0.50})N$ layers and $(Al_{0.67}Ti_{0.33})N$ layers, the comparison of the metal elements present in these two kinds of layers shows that the Al element is contained in the two layers while the Cr element is present only in one of the layers and the Ti element is present only in the other of the layers. Thus, the above requirement is satisfied.

Similarly, in the coated tool of the present invention, it is more preferable that one layer constituting the second stack structure and another layer constituting the second stack structure which is adjacent to the one layer include one or more metal elements different between the layers. With such a configuration, crystal lattices may be misaligned at the interface between the layers and consequently the structure may easily cause a crack to advance in a direction parallel to the interface between the layers, thus achieving an enhancement in the effect of suppressing the penetration of cracks to the substrate.

In the coated tool of the present invention, the coating layer includes the first stack structure having excellent fracture resistance and the second stack structure having excellent wear resistance. As a result, the coated tool exhibits excellent fracture resistance and wear resistance. The coating layer may include an upper layer on the surface of the coating layer on the side opposite to the substrate through the first stack structure and the second stack structure. Further, the coating layer may include a lower layer at a closer side to the substrate than the first and second stack structures. Furthermore, the coating layer may include an intermediate layer between the first stack structure and the second stack structure.

The configurations of these upper layers, intermediate layers and lower layers are not particularly limited and any of coating layers provided in coated tools may be used. In particular, enhanced wear resistance may be advantageously obtained by adopting a single layer configuration or a non-periodic multilayer configuration including at least one selected from the group consisting of a metal including at least one metal element selected from Ti, Zr, Hf, V, Nb, Ta, Cr, Mo, W, Al, Si, Sr, Y, Sn and Bi; and compounds including at least one of these metal elements and at least one non-metal element selected from carbon, nitrogen, oxygen and boron.

In a more preferred embodiment, the first stack structures and the second stack structures are stacked alternately and continuously each in two or more layers. With this configuration, the structure may easily cause a crack to advance in a direction parallel to the interface between the first stack structure and the second stack structure, and thus effectively suppresses the penetration of cracks to the substrate, namely, achieves enhanced fracture resistance. The positional relationship between the first stack structure and the second stack structure is not limited and may be such that the first stack structure is closest to the substrate and the second stack structure is closest to the surface of the coating layer on the side opposite to the substrate or may be such that the second stack structure is closest to the substrate and the first stack structure is closest to the surface of the coating layer on the side opposite to the substrate. Alternatively, the first stack structure or the second stack structure may be disposed closest to both the substrate and the surface of the coating layer on the side opposite to the substrate. Based on the fact that the residual compressive stress in the first stack structure is lower than the residual compressive stress in the second stack structure, it is more preferable that the first stack structure be disposed closest to the substrate and the second stack structure be disposed closest to the surface. In this case, the coating layer tends to exhibit enhanced separation resistance.

The coating layer in the coated tool of the present invention may be produced by any methods without limitation. For example, a physical deposition method such as an ion plating method, an arc ion plating method, a sputtering method or an ion mixing method may be used to form layers such as the aforementioned first stack structure and second stack structure onto the substrate. In particular, the arc ion plating method is more preferable because of excellent adhesion between the coating layer and the substrate.

The coated tool of the present invention may be obtained by forming the layers onto the surface of the substrate by a conventional coating method. An exemplary production method is described below.

A substrate processed into a shape of a tool is placed in a reaction vessel of a physical deposition apparatus, and a vacuum is produced by evacuating the inside of the reaction vessel to a pressure of $1\times10^{-2}$ Pa or below. After the vacuum has been generated, the temperature of the substrate is raised to 200 to 800° C. with a heater disposed in the reaction vessel. After the heating, Ar gas is introduced into the reaction vessel to raise the pressure to 0.5 to 5.0 Pa. In the Ar gas atmosphere at a pressure of 0.5 to 5.0 Pa, a bias voltage of −200 to −1000 V is applied to the substrate and a current of 5 to 20 A is passed through a tungsten filament disposed in the reaction vessel, thereby treating the surface of the substrate by ion bombardment of the Ar gas. After the surface of the substrate has been treated by ion bombardment, a vacuum is drawn to a pressure of $1\times10^{-2}$ Pa or below.

Next, a reaction gas such as nitrogen gas is introduced into the reaction vessel to increase the pressure inside the reaction vessel to 0.5 to 5.0 Pa. A bias voltage of −10 to −150 V is applied to the substrate, and metal deposition sources in accordance with the metal components of the respective layers are vaporized by arc discharge, thereby forming layers on the surface of the substrate. In the case where two or more kinds of separately-arranged metal deposition sources are vaporized at the same time by arc discharge and layers for constituting the first stack structure or the second stack structure are formed while rotating a rotatable table on which the substrate has been fixed, the layer thicknesses of the respective layers for constituting the first stack structure or the second stack structure may be controlled by adjusting the rotational speed of the rotatable table supporting the substrate in the reaction vessel. When two or more kinds of metal deposition sources are vaporized alternately by arc discharge to form layers for constituting the first stack structure or the second stack structure, the layer thicknesses of the respective layers for constituting the first stack structure or the second stack structure may be controlled by adjusting the arc discharge time for the respective metal deposition sources.

The layer thicknesses of the respective layers constituting the coating layer in the coated tool of the present invention may be measured by analyzing the sectional structure of the coated tool with a device such as an optical microscope, a scanning electron microscope (SEM) or a transmission electron microscope (TEM). The average layer thickness of each of the layers in the coated tool of the present invention may be obtained by measuring the layer thickness of each layer with respect to cross sections sampled from 3 or more regions approximately 50 μm from the cutting edge of the surface opposed to the metal deposition source toward the center of the surface, and calculating the average value of the obtained layer thicknesses.

The composition of each of the layers in the coated tool of the present invention may be measured by analyzing the sectional structure of the coated tool of the present invention with a device such as an energy dispersive X-ray spectrometer (EDS) or a wavelength dispersive X-ray spectrometer (WDS).

Specific examples of the coated tools of the present invention include cutting inserts, drills and end mills.

EXAMPLES

Example 1

A cemented carbide corresponding to P10 in the shape of ISO SEEN 1203 insert was provided as a substrate. Metal deposition sources were arranged in a reaction vessel of an arc ion plating apparatus so as to design layers having compositions described in any of Tables 1 to 3. The substrate was fixed to a fixing hardware of a rotatable table disposed in the reaction vessel.

Thereafter, a vacuum was produced by evacuating the inside of the reaction vessel to a pressure of $5.0 \times 10^{-3}$ Pa or below. After the vacuum had been generated, the substrate was heated to a temperature of 500° C. with a heater disposed in the reaction vessel. After the heating, Ar gas was introduced into the reaction vessel to raise the pressure to 5.0 Pa.

In the Ar gas atmosphere at a pressure of 5.0 Pa, a bias voltage of −1000 V was applied to the substrate and a current of 10 A was passed through a tungsten filament disposed in the reaction vessel, thereby treating the surface of the substrate by ion bombardment of the Ar gas for 30 minutes. After the completion of the ion bombardment treatment, the inside of the reaction vessel was evacuated to draw a vacuum to a pressure of $5.0 \times 10^{-3}$ Pa or below.

After the vacuum had been produced, nitrogen gas was introduced into the reaction vessel to create a nitrogen gas atmosphere having a pressure of 2.7 Pa. A bias voltage of −50 V was applied to the substrate, and an arc current of 200 A was passed to produce arc discharge and thereby to vaporize the metal deposition sources, thus forming the respective layers.

In the formation of Layers A1 and Layers B1 in Inventive Products 1 to 11, the metal deposition source for Layers A1 and the metal deposition source for Layers B1 were alternately vaporized by arc discharge to form Layers A1 and Layers B1. During this process, the layer thicknesses of Layers A1 and Layers B1 were controlled by adjusting the respective arc discharge times. In the fabrication of Comparative Product 1, Layers X and Layers Y with large layer thicknesses were formed in the similar manner by alternately vaporizing the metal deposition source for Layers X and the metal deposition source for Layers Y by arc discharge. During this process, the layer thicknesses of Layers X and Layers Y were controlled by adjusting the respective arc discharge times.

In the formation of Layers A2 and Layers B2 in Inventive Products 1 to 11, the metal deposition source for Layers A2 and the metal deposition source for Layers B2 were simultaneously vaporized by arc discharge to form Layers A2 and Layers B2. During this process, the layer thicknesses of Layers A2 and Layers B2 were controlled by adjusting the rotational speed of the rotatable table in the range of 0.2 to 10 $min^{-1}$. In the fabrication of Comparative Product 2, Layers X and Layers Y with small layer thicknesses were formed in the similar manner by simultaneously vaporizing the metal deposition source for Layers X and the metal deposition source for Layers Y by arc discharge. During this process, the layer thicknesses of Layers X and Layers Y were controlled by adjusting the rotational speed of the rotatable table in the range of 0.2 to 10 $min^{-1}$.

After the layers had been formed on the surface of the substrate to the prescribed layer thicknesses, the heater was turned off. After the sample temperature had decreased to 100° C. or below, the sample was collected from the reaction vessel.

TABLE 1

| | First stack structure | | | | | |
|---|---|---|---|---|---|---|
| | Layers A1 | | Layers B1 | | Layers A1 + Layers B1 | | |
| Sample No. | Composition | Average layer thickness (nm) | Composition | Average layer thickness (nm) | Average value of stacking periods $T_1$ (nm) | Number of repetitions (times) | Average thickness (μm) |
| Inv. Prod. 1 | $(Al_{0.50}Ti_{0.50})N$ | 100 | $(Al_{0.67}Ti_{0.33})N$ | 100 | 200 | 5 | 1.0 |
| Inv. Prod. 2 | $(Al_{0.50}Ti_{0.50})N$ | 60 | $(Al_{0.67}Ti_{0.33})N$ | 60 | 120 | 10 | 1.2 |
| Inv. Prod. 3 | $(Al_{0.50}Ti_{0.50})N$ | 250 | $(Al_{0.67}Ti_{0.33})N$ | 250 | 500 | 2 | 1.0 |
| Inv. Prod. 4 | $(Al_{0.50}Ti_{0.50})N$ | 100 | $(Al_{0.67}Ti_{0.33})N$ | 100 | 200 | 10 | 2.0 |
| Inv. Prod. 5 | $(Al_{0.50}Ti_{0.50})N$ | 100 | $(Al_{0.67}Ti_{0.33})N$ | 100 | 200 | 5 | 1.0 |
| Inv. Prod. 6 | $(Al_{0.50}Ti_{0.50})N$ | 60 | $(Al_{0.67}Ti_{0.33})N$ | 60 | 120 | 3 | 0.36 |
| Inv. Prod. 7 | $(Al_{0.50}Ti_{0.50})N$ | 250 | $(Al_{0.67}Ti_{0.33})N$ | 250 | 500 | 4 | 2.0 |
| Inv. Prod. 8 | $(Al_{0.50}Ti_{0.50})N$ | 60 | $(Al_{0.67}Ti_{0.33})N$ | 60 | 120 | 3 | 0.36 |
| Inv. Prod. 9 | $(Al_{0.50}Ti_{0.50})N$ | 250 | $(Al_{0.67}Ti_{0.33})N$ | 250 | 500 | 4 | 2.0 |
| Inv. Prod. 10 | $(Al_{0.50}Ti_{0.50})N$ | 60 | $(Al_{0.67}Ti_{0.33})N$ | 60 | 120 | 3 | 0.36 |
| Inv. Prod. 11 | $(Al_{0.50}Ti_{0.50})N$ | 250 | $(Al_{0.67}Ti_{0.33})N$ | 250 | 500 | 4 | 2.0 |

TABLE 1-continued

| | Second stack structure | | | | | | | |
|---|---|---|---|---|---|---|---|---|
| | Layers A2 | | Layers B2 | | Layers A2 + Layers B2 | | | |
| Sample No. | Composition | Average layer thickness (nm) | Composition | Average layer thickness (nm) | Average value of stacking periods $T_2$ (nm) | Number of repetitions (times) | Average thickness (μm) | $T_1 - T_2$ (nm) |
| Inv. Prod. 1 | $(Al_{0.50}Ti_{0.50})N$ | 10 | $(Al_{0.67}Ti_{0.33})N$ | 10 | 20 | 50 | 1.0 | 180 |
| Inv. Prod. 2 | $(Al_{0.50}Ti_{0.50})N$ | 10 | $(Al_{0.67}Ti_{0.33})N$ | 10 | 20 | 25 | 0.5 | 100 |
| Inv. Prod. 3 | $(Al_{0.50}Ti_{0.50})N$ | 10 | $(Al_{0.67}Ti_{0.33})N$ | 10 | 20 | 100 | 2.0 | 480 |
| Inv. Prod. 4 | $(Al_{0.50}Ti_{0.50})N$ | 2 | $(Al_{0.67}Ti_{0.33})N$ | 2 | 4 | 100 | 0.4 | 196 |
| Inv. Prod. 5 | $(Al_{0.50}Ti_{0.50})N$ | 45 | $(Al_{0.67}Ti_{0.33})N$ | 45 | 90 | 10 | 0.9 | 110 |
| Inv. Prod. 6 | $(Al_{0.50}Ti_{0.50})N$ | 35 | $(Al_{0.67}Ti_{0.33})N$ | 35 | 70 | 30 | 2.1 | 50 |
| Inv. Prod. 7 | $(Al_{0.50}Ti_{0.50})N$ | 2 | $(Al_{0.67}Ti_{0.33})N$ | 2 | 4 | 200 | 0.8 | 496 |
| Inv. Prod. 8 | $(Al_{0.50}Ti_{0.50})N$ | 35 | $(Al_{0.67}Ti_{0.33})N$ | 35 | 70 | 30 | 2.1 | 50 |
| Inv. Prod. 9 | $(Al_{0.50}Ti_{0.50})N$ | 2 | $(Al_{0.67}Ti_{0.33})N$ | 2 | 4 | 200 | 0.8 | 496 |
| Inv. Prod. 10 | $(Al_{0.50}Ti_{0.50})N$ | 35 | $(Al_{0.67}Ti_{0.33})N$ | 35 | 70 | 30 | 2.1 | 50 |
| Inv. Prod. 11 | $(Al_{0.50}Ti_{0.50})N$ | 2 | $(Al_{0.67}Ti_{0.33})N$ | 2 | 4 | 200 | 0.8 | 496 |

TABLE 2

| | Coating layer | | | | | | | | | | |
|---|---|---|---|---|---|---|---|---|---|---|---|
| | First layer (substrate side) Lower layer | | Second layer | | Third layer Intermediate layer | | Fourth layer | | Fifth layer (surface side) Upper layer | | |
| Sample No. | Composition | Average thick. (μm) | Stack structure | Average thick. (μm) | Composition | Average thick. (μm) | Stack structure | Average thick (μm) | Composition | Average thick. (μm) | Total layer thick. (μm) |
| Inv. Prod. 1 | TiN | 0.5 | First | 1.0 | TiN | 0.5 | Second | 1.0 | TiN | 0.5 | 3.5 |
| Inv. Prod. 2 | TiN | 0.5 | First | 1.2 | TiN | 0.5 | Second | 0.5 | TiN | 0.5 | 3.2 |
| Inv. Prod. 3 | TiN | 0.5 | First | 1.0 | TiN | 0.5 | Second | 2.0 | TiN | 0.5 | 4.5 |
| Inv. Prod. 4 | TiN | 0.5 | First | 2.0 | TiN | 0.5 | Second | 0.4 | TiN | 0.5 | 3.9 |
| Inv. Prod. 5 | TiN | 0.5 | First | 1.0 | TiN | 0.5 | Second | 0.9 | TiN | 0.5 | 3.4 |
| Inv. Prod. 6 | TiN | 0.5 | First | 0.36 | TiN | 0.5 | Second | 2.1 | TiN | 0.5 | 3.96 |
| Inv. Prod. 7 | TiN | 0.5 | First | 2.0 | TiN | 0.5 | Second | 0.8 | TiN | 0.5 | 4.3 |
| Inv. Prod. 8 | $(Ti_{0.60}Al_{0.40})N$ | 0.5 | First | 0.36 | $(Ti_{0.60}Al_{0.40})N$ | 0.5 | Second | 2.1 | $(Ti_{0.60}Al_{0.40})N$ | 0.5 | 3.96 |
| Inv. Prod. 9 | $(Ti_{0.60}Al_{0.40})N$ | 0.5 | First | 2.0 | $(Ti_{0.60}Al_{0.40})N$ | 0.5 | Second | 0.8 | $(Ti_{0.60}Al_{0.40})N$ | 0.5 | 4.3 |
| Inv. Prod. 10 | $(Ti_{0.85}Si_{0.15})N$ | 0.5 | First | 0.36 | $(Ti_{0.85}Si_{0.15})N$ | 0.5 | Second | 2.1 | $(Ti_{0.85}Si_{0.15})N$ | 0.5 | 3.96 |
| Inv. Prod. 11 | $(Ti_{0.85}Si_{0.15})N$ | 0.5 | First | 2.0 | $(Ti_{0.85}Si_{0.15})N$ | 0.5 | Second | 0.8 | $(Ti_{0.85}Si_{0.15})N$ | 0.5 | 4.3 |

*"First" and "Second" in the sections "Stacked structure" indicate the first stack structure and the second stack structure in Inventive Products with the corresponding numbers in Table 1.

TABLE 3

| | Coating layer | | | | | | |
|---|---|---|---|---|---|---|---|
| | Stack structure | | | | | | |
| | Layers X | | Layers Y | | Layers X + Layers Y | | |
| Sample No. | Composition | Average layer thickness (nm) | Composition | Average layer thickness (nm) | Average value of stacking periods T (nm) | Number of repetitions (times) | Total layer thickness (μm) |
| Comp. Prod. 1 | $(Al_{0.50}Ti_{0.50})N$ | 100 | $(Al_{0.67}Ti_{0.33})N$ | 100 | 200 | 20 | 4.0 |
| Comp. Prod. 2 | $(Al_{0.50}Ti_{0.50})N$ | 10 | $(Al_{0.67}Ti_{0.33})N$ | 10 | 20 | 200 | 4.0 |

The respective average layer thicknesses of the layers in the samples obtained were determined by measuring the layer thickness of each layer by TEM observation with respect to cross sections sampled from 3 regions approximately 50 μm from the cutting edge of the surface of the coated tool opposed to the metal deposition source toward the center of the surface, and calculating the average value of the obtained layer thicknesses. The respective compositions of the layers in the samples obtained were determined by analyzing a cross section sampled from a region of from the cutting edge of the surface of the coated tool opposed to the metal deposition source to a distance of 50 μm toward the center using an EDS. The results are described in Tables 1 to 3. The compositional ratios of the metal elements in the layers described in Tables 1 to 3 indicate the atomic ratios of the metal elements relative to the total of the metal elements in the metal compounds forming the respective layers.

The fracture resistance of the samples obtained above was evaluated by using the samples in face milling under the following test conditions. The evaluation results are described in Table 4.

[Test conditions]
Workpieces: SCM440
Workpiece shape: cuboid of 105 mm×200 mm×60 mm (having 6 holes with a diameter of 30 mm in the 105 mm×200 mm face to be milled of the cuboid)
Cutting rate: 250 m/min
Feed: 0.4 mm/tooth
Depth of cut: 2.0 mm
Cutting width: 105 mm
Coolant: none
Effective cutter diameter: 125 mm
Evaluation item: The length of cutting to the occurrence of fracture of the sample (the occurrence of fracture in the cutting blade of the sample) was measured.

TABLE 4

| Sample No. | Length of cutting (m) |
|---|---|
| Inventive Product 1 | 7.0 |
| Inventive Product 2 | 6.2 |
| Inventive Product 3 | 5.5 |
| Inventive Product 4 | 6.9 |
| Inventive Product 5 | 5.3 |
| Inventive Product 6 | 4.7 |
| Inventive Product 7 | 5.5 |
| Inventive Product 8 | 4.8 |
| Inventive Product 9 | 6.5 |
| Inventive Product 10 | 4.6 |
| Inventive Product 11 | 5.3 |
| Comparative Product 1 | 3.3 |
| Comparative Product 2 | 3.6 |

The results in Table 4 show that Inventive Products achieved a longer length of cutting and had a longer tool life than Comparative Products which had an alternate stack structure composed of layers with various uniform layer thicknesses.

Example 2

A cemented carbide corresponding to P10 in the shape of ISO SEEN 1203 insert was provided as a substrate. Metal deposition sources were arranged in a reaction vessel of an arc ion plating apparatus so as to design layers having compositions described in Table 5. Samples having layer configurations described in Tables 5 and 6 were fabricated by the same production method as in Example 1.

TABLE 5

| | First stack structure ||||||
|---|---|---|---|---|---|---|
| | Layers A1 || Layers B1 || Layers A1 + Layers B1 || |
| Sample No. | Composition | Average layer thickness (nm) | Composition | Average layer thickness (nm) | Average value of stacking periods $T_1$ (nm) | Number of repetitions (times) | Average thickness (μm) |
| Inv. Prod. 12 | $(Al_{0.50}Ti_{0.50})N$ | 60 | $(Al_{0.67}Ti_{0.33})N$ | 60 | 120 | 5 | 0.6 |
| Inv. Prod. 13 | $(Al_{0.50}Ti_{0.50})N$ | 100 | $(Al_{0.67}Ti_{0.33})N$ | 100 | 200 | 10 | 2.0 |
| Inv. Prod. 14 | $(Al_{0.50}Ti_{0.50})N$ | 250 | $(Al_{0.67}Ti_{0.33})N$ | 250 | 500 | 12 | 6.0 |
| Inv. Prod. 15 | $(Al_{0.50}Ti_{0.50})N$ | 100 | $(Al_{0.67}Ti_{0.33})N$ | 100 | 200 | 5 | 1.0 |
| Inv. Prod. 16 | $(Al_{0.50}Ti_{0.50})N$ | 60 | $(Al_{0.67}Ti_{0.33})N$ | 60 | 120 | 10 | 1.2 |
| Inv. Prod. 17 | $(Al_{0.50}Ti_{0.50})N$ | 60 | $(Al_{0.67}Ti_{0.33})N$ | 60 | 120 | 10 | 1.2 |
| Inv. Prod. 18 | $(Al_{0.50}Ti_{0.50})N$ | 250 | $(Al_{0.67}Ti_{0.33})N$ | 250 | 500 | 4 | 2.0 |
| Inv. Prod. 19 | $(Al_{0.50}Ti_{0.50})N$ | 100 | $(Al_{0.67}Ti_{0.33})N$ | 100 | 200 | 5 | 1.0 |
| Inv. Prod. 20 | $(Al_{0.50}Ti_{0.50})N$ | 100 | $(Al_{0.67}Ti_{0.33})N$ | 100 | 200 | 2 | 0.4 |
| Inv. Prod. 21 | $(Al_{0.50}Ti_{0.50})N$ | 60 | $(Al_{0.67}Ti_{0.33})N$ | 60 | 120 | 10 | 1.2 |
| Inv. Prod. 22 | $(Al_{0.50}Ti_{0.50})N$ | 250 | $(Al_{0.67}Ti_{0.33})N$ | 250 | 500 | 2 | 1.0 |

TABLE 5-continued

| | Second stack structure | | | | | | | |
|---|---|---|---|---|---|---|---|---|
| | Layers A2 | | Layers B2 | | Layers A2 + Layers B2 | | | |
| Sample No. | Composition | Average layer thickness (nm) | Composition | Average layer thickness (nm) | Average value of stacking periods $T_2$ (nm) | Number of repetitions (times) | Average thickness (μm) | $T_1 - T_2$ (nm) |
| Inv. Prod. 12 | $(Al_{0.50}Ti_{0.50})N$ | 2 | $(Al_{0.67}Ti_{0.33})N$ | 2 | 4 | 125 | 0.5 | 116 |
| Inv. Prod. 13 | $(Al_{0.50}Ti_{0.50})N$ | 10 | $(Al_{0.67}Ti_{0.33})N$ | 10 | 20 | 100 | 2.0 | 180 |
| Inv. Prod. 14 | $(Al_{0.50}Ti_{0.50})N$ | 10 | $(Al_{0.67}Ti_{0.33})N$ | 10 | 20 | 300 | 6.0 | 480 |
| Inv. Prod. 15 | $(Al_{0.50}Ti_{0.50})N$ | 10 | $(Al_{0.67}Ti_{0.33})N$ | 10 | 20 | 50 | 1.0 | 180 |
| Inv. Prod. 16 | $(Al_{0.50}Ti_{0.50})N$ | 10 | $(Al_{0.67}Ti_{0.33})N$ | 10 | 20 | 50 | 1.0 | 100 |
| Inv. Prod. 17 | $(Al_{0.50}Ti_{0.50})N$ | 2 | $(Al_{0.67}Ti_{0.33})N$ | 2 | 4 | 250 | 1.0 | 116 |
| Inv. Prod. 18 | $(Al_{0.50}Ti_{0.50})N$ | 10 | $(Al_{0.67}Ti_{0.33})N$ | 10 | 20 | 10 | 0.2 | 480 |
| Inv. Prod. 19 | $(Al_{0.50}Ti_{0.50})N$ | 40 | $(Al_{0.67}Ti_{0.33})N$ | 40 | 80 | 13 | 1.04 | 120 |
| Inv. Prod. 20 | $(Al_{0.50}Ti_{0.50})N$ | 10 | $(Al_{0.67}Ti_{0.33})N$ | 10 | 20 | 25 | 0.5 | 180 |
| Inv. Prod. 21 | $(Al_{0.50}Ti_{0.50})N$ | 40 | $(Al_{0.67}Ti_{0.33})N$ | 40 | 80 | 5 | 0.4 | 40 |
| Inv. Prod. 22 | $(Al_{0.50}Ti_{0.50})N$ | 2 | $(Al_{0.67}Ti_{0.33})N$ | 2 | 4 | 250 | 1.0 | 496 |

TABLE 6

| | Coating layer | | | | | | | | | |
|---|---|---|---|---|---|---|---|---|---|---|
| | First layer (substrate side) | | Second layer | | Third layer | | Fourth layer | | Fifth layer | |
| Sample No. | Stack structure | Average thick. (μm) | Stack structure | Average thick. (μm) | Stack structure | Average thick. (μm) | Stack structure | Average thick. (μm) | Stack structure | Average thick. (μm) |
| Inv. Prod. 12 | First | 0.6 | Second | 0.5 | — | — | — | — | — | — |
| Inv. Prod. 13 | First | 2.0 | Second | 2.0 | — | — | — | — | — | — |
| Inv. Prod. 14 | First | 6.0 | Second | 6.0 | — | — | — | — | — | — |
| Inv. Prod. 15 | First | 1.0 | Second | 1.0 | First | 1.0 | Second | 1.0 | — | — |
| Inv. Prod. 16 | First | 1.2 | Second | 1.0 | First | 1.2 | Second | 1.0 | — | — |
| Inv. Prod. 17 | First | 1.2 | Second | 1.0 | First | 1.2 | Second | 1.0 | — | — |
| Inv. Prod. 18 | First | 2.0 | Second | 0.2 | First | 2.0 | Second | 0.2 | — | — |
| Inv. Prod. 19 | First | 1.0 | Second | 1.04 | First | 1.0 | Second | 1.04 | — | — |
| Inv. Prod. 20 | First | 0.4 | Second | 0.5 | First | 0.4 | Second | 0.5 | First | 0.4 |
| Inv. Prod. 21 | First | 1.2 | Second | 0.4 | First | 1.2 | Second | 0.4 | First | 1.2 |
| Inv. Prod. 22 | First | 1.0 | Second | 1.0 | First | 1.0 | Second | 1.0 | First | 1.0 |

TABLE 6-continued

| | Coating layer | | | | | | |
|---|---|---|---|---|---|---|---|
| | Sixth layer | | Seventh layer | | Eighth layer (surface side) | | |
| Sample No. | Stack structure | Average thick. (μm) | Stack structure | Average thick. (μm) | Stack structure | Average thick. (μm) | Total layer thick. (μm) |
| Inv. Prod. 12 | — | — | — | — | — | — | 1.1 |
| Inv. Prod. 13 | — | — | — | — | — | — | 4.0 |
| Inv. Prod. 14 | — | — | — | — | — | — | 12.0 |
| Inv. Prod. 15 | — | — | — | — | — | — | 4.0 |
| Inv. Prod. 16 | — | — | — | — | — | — | 4.4 |
| Inv. Prod. 17 | — | — | — | — | — | — | 4.4 |
| Inv. Prod. 18 | — | — | — | — | — | — | 4.4 |
| Inv. Prod. 19 | — | — | — | — | — | — | 4.08 |
| Inv. Prod. 20 | Second | 0.5 | — | — | — | — | 2.7 |
| Inv. Prod. 21 | Second | 0.4 | First | 1.2 | Second | 0.4 | 6.4 |
| Inv. Prod. 22 | Second | 1.0 | First | 1.0 | Second | 1.0 | 8.0 |

*"First" and "Second" in the sections "Stacked structure" indicate the first stack structure and the second stack structure in Inventive Products with the corresponding numbers in Table 5.

The respective average layer thicknesses and the respective compositions of the layers in the samples obtained were determined in the same manner as in Example 1, the results being described in Tables 5 and 6. Further, the fracture resistance of the samples obtained was evaluated by using the samples in face milling under the same test conditions as in Example 1. The evaluation results are described in Table 7.

TABLE 7

| Sample No. | Length of cutting (m) |
|---|---|
| Inventive Product 12 | 7.5 |
| Inventive Product 13 | 9.1 |
| Inventive Product 14 | 6.6 |
| Inventive Product 15 | 9.2 |
| Inventive Product 16 | 8.8 |
| Inventive Product 17 | 9.1 |
| Inventive Product 18 | 6.6 |
| Inventive Product 19 | 7.5 |
| Inventive Product 20 | 7.8 |
| Inventive Product 21 | 7.2 |
| Inventive Product 22 | 6.6 |
| Comparative Product 1 | 3.3 |
| Comparative Product 2 | 3.6 |

From Table 7, it has been shown that Inventive Products achieved a longer length of cutting and had a longer tool life than Comparative Products which had an alternate stack structure composed of layers with various uniform layer thicknesses.

Example 3

A cemented carbide corresponding to P10 in the shape of ISO SEEN 1203 insert was provided as a substrate. In the fabrication of Inventive Products 23 and 25 to 35 and Comparative Products 3 and 5 to 15 , metal deposition sources were arranged in a reaction vessel of an arc ion plating apparatus so as to design layers having compositions described in Tables 8 and 10, and samples having layer configurations described in Tables 9 and 10 were fabricated by the same production method as in Example 1.

In the fabrication of Inventive Product 24 and Comparative Product 4, metal deposition sources were arranged in a reaction vessel of an arc ion plating apparatus so as to design layers having compositions described in Tables 8 and 10, and samples having layer configurations described in Tables 9 and 10 were fabricated in the same manner as in Example 1 except that the atmosphere in the reaction vessel during the formation of layers was created by feeding a mixed gas containing $N_2$ gas and $CH_4$ gas in a partial pressure ratio $N_2:CH_4=1:1$ to a pressure inside the reaction vessel of 2.7 Pa.

TABLE 8

| | First stack structure | | | | | | |
|---|---|---|---|---|---|---|---|
| | Layers A1 | | Layers B1 | | Layers A1 + Layers B1 | | |
| Sample No. | Composition | Average layer thickness (nm) | Composition | Average layer thickness (nm) | Average value of stacking periods $T_1$ (nm) | Number of repetitions (times) | Average thickness (μm) |
| Inv. Prod. 23 | $(Al_{0.50}Ti_{0.50})N$ | 100 | $(Al_{0.60}Ti_{0.40})N$ | 100 | 200 | 5 | 1.0 |
| Inv. Prod. 24 | $(Al_{0.50}Ti_{0.50})CN$ | 100 | $(Al_{0.67}Ti_{0.33})CN$ | 100 | 200 | 5 | 1.0 |
| Inv. Prod. 25 | $(Al_{0.50}Ti_{0.50})N$ | 100 | $(Al_{0.45}Ti_{0.45}Si_{0.10})N$ | 100 | 200 | 5 | 1.0 |
| Inv. Prod. 26 | $(Al_{0.50}Ti_{0.50})N$ | 100 | $(Al_{0.45}Ti_{0.45}Sr_{0.10})N$ | 100 | 200 | 5 | 1.0 |
| Inv. Prod. 27 | $(Al_{0.50}Ti_{0.50})N$ | 100 | $(Al_{0.45}Ti_{0.45}Y_{0.10})N$ | 100 | 200 | 5 | 1.0 |
| Inv. Prod. 28 | $(Al_{0.50}Ti_{0.50})N$ | 100 | $(Al_{0.50}Ti_{0.30}Cr_{0.20})N$ | 100 | 200 | 5 | 1.0 |
| Inv. Prod. 29 | $(Al_{0.50}Ti_{0.50})N$ | 100 | $(Al_{0.50}Ti_{0.45}Nb_{0.05})N$ | 100 | 200 | 5 | 1.0 |
| Inv. Prod. 30 | $(Al_{0.50}Ti_{0.50})N$ | 100 | $(Al_{0.50}Ti_{0.45}Ta_{0.05})N$ | 100 | 200 | 5 | 1.0 |
| Inv. Prod. 31 | $(Al_{0.50}Ti_{0.50})N$ | 100 | $(Al_{0.50}Ti_{0.45}W_{0.05})N$ | 100 | 200 | 5 | 1.0 |
| Inv. Prod. 32 | $(Al_{0.50}Cr_{0.50})N$ | 100 | $(Al_{0.67}Ti_{0.33})N$ | 100 | 200 | 5 | 1.0 |
| Inv. Prod. 33 | $(Al_{0.50}Cr_{0.50})N$ | 100 | $(Ti_{0.50}Si_{0.10})N$ | 100 | 200 | 5 | 1.0 |
| Inv. Prod. 34 | $(Ti_{0.50}Cr_{0.50})N$ | 100 | $(Al_{0.67}Ti_{0.33})N$ | 100 | 200 | 5 | 1.0 |
| Inv. Prod. 35 | $(Ti_{0.50}Cr_{0.50})N$ | 100 | $(Ti_{0.90}Si_{0.10})N$ | 100 | 200 | 5 | 1.0 |

| | Second stack structure | | | | | | | |
|---|---|---|---|---|---|---|---|---|
| | Layers A2 | | Layers B2 | | Layers A2 + Layers B2 | | | |
| Sample No. | Composition | Average layer thickness (nm) | Composition | Average layer thickness (nm) | Average value of stacking periods $T_2$ (nm) | Number of repetitions (times) | Average thickness (μm) | $T_1 - T_2$ (nm) |
| Inv. Prod. 23 | $(Al_{0.50}Ti_{0.50})N$ | 10 | $(Al_{0.60}Ti_{0.40})N$ | 10 | 20 | 50 | 1.0 | 180 |
| Inv. Prod. 24 | $(Al_{0.50}Ti_{0.50})CN$ | 10 | $(Al_{0.67}Ti_{0.33})CN$ | 10 | 20 | 50 | 1.0 | 180 |
| Inv. Prod. 25 | $(Al_{0.50}Ti_{0.50})N$ | 10 | $(Al_{0.45}Ti_{0.45}Si_{0.10})N$ | 10 | 20 | 50 | 1.0 | 180 |
| Inv. Prod. 26 | $(Al_{0.50}Ti_{0.50})N$ | 10 | $(Al_{0.45}Ti_{0.45}Sr_{0.10})N$ | 10 | 20 | 50 | 1.0 | 180 |
| Inv. Prod. 27 | $(Al_{0.50}Ti_{0.50})N$ | 10 | $(Al_{0.45}Ti_{0.45}Y_{0.10})N$ | 10 | 20 | 50 | 1.0 | 180 |
| Inv. Prod. 28 | $(Al_{0.50}Ti_{0.50})N$ | 10 | $(Al_{0.50}Ti_{0.30}Cr_{0.20})N$ | 10 | 20 | 50 | 1.0 | 180 |
| Inv. Prod. 29 | $(Al_{0.50}Ti_{0.50})N$ | 10 | $(Al_{0.50}Ti_{0.45}Nb_{0.05})N$ | 10 | 20 | 50 | 1.0 | 180 |
| Inv. Prod. 30 | $(Al_{0.50}Ti_{0.50})N$ | 10 | $(Al_{0.50}Ti_{0.45}Ta_{0.05})N$ | 10 | 20 | 50 | 1.0 | 180 |
| Inv. Prod. 31 | $(Al_{0.50}Ti_{0.50})N$ | 10 | $(Al_{0.50}Ti_{0.45}W_{0.05})N$ | 10 | 20 | 50 | 1.0 | 180 |
| Inv. Prod. 32 | $(Al_{0.50}Cr_{0.50})N$ | 10 | $(Al_{0.67}Ti_{0.33})N$ | 10 | 20 | 50 | 1.0 | 180 |
| Inv. Prod. 33 | $(Al_{0.50}Cr_{0.50})N$ | 10 | $(Ti_{0.90}Si_{0.10})N$ | 10 | 20 | 50 | 1.0 | 180 |
| Inv. Prod. 34 | $(Ti_{0.50}Cr_{0.50})N$ | 10 | $(Al_{0.67}Ti_{0.33})N$ | 10 | 20 | 50 | 1.0 | 180 |
| Inv. Prod. 35 | $(Ti_{0.50}Cr_{0.50})N$ | 10 | $(Ti_{0.90}Si_{0.10})N$ | 10 | 20 | 50 | 1.0 | 180 |

TABLE 9

| | Coating layer | | | | | | | |
|---|---|---|---|---|---|---|---|---|
| | First layer (substrate side) | | Second layer | | Third layer | | Fourth layer (surface side) | |
| Sample No. | Stack structure | Average thick. (μm) | Stack structure | Average thick. (μm) | Stack structure | Average thick. (μm) | Stack structure | Average thick (μm) | Total layer thickness (μm) |
| Inv. Prod. 23 | First | 1.0 | Second | 1.0 | First | 1.0 | Second | 1.0 | 4.0 |
| Inv. Prod. 24 | First | 1.0 | Second | 1.0 | First | 1.0 | Second | 1.0 | 4.0 |
| Inv. Prod. 25 | First | 1.0 | Second | 1.0 | First | 1.0 | Second | 1.0 | 4.0 |
| Inv. Prod. 26 | First | 1.0 | Second | 1.0 | First | 1.0 | Second | 1.0 | 4.0 |
| Inv. Prod. 27 | First | 1.0 | Second | 1.0 | First | 1.0 | Second | 1.0 | 4.0 |
| Inv. Prod. 28 | First | 1.0 | Second | 1.0 | First | 1.0 | Second | 1.0 | 4.0 |
| Inv. Prod. 29 | First | 1.0 | Second | 1.0 | First | 1.0 | Second | 1.0 | 4.0 |
| Inv. Prod. 30 | First | 1.0 | Second | 1.0 | First | 1.0 | Second | 1.0 | 4.0 |
| Inv. Prod. 31 | First | 1.0 | Second | 1.0 | First | 1.0 | Second | 1.0 | 4.0 |
| Inv. Prod. 32 | First | 1.0 | Second | 1.0 | First | 1.0 | Second | 1.0 | 4.0 |
| Inv. Prod. 33 | First | 1.0 | Second | 1.0 | First | 1.0 | Second | 1.0 | 4.0 |
| Inv. Prod. 34 | First | 1.0 | Second | 1.0 | First | 1.0 | Second | 1.0 | 4.0 |
| Inv. Prod. 35 | First | 1.0 | Second | 1.0 | First | 1.0 | Second | 1.0 | 4.0 |

*"First" and "Second" in the sections "Stacked structure" indicate the first stack structure and the second stack structure in Inventive Products with the corresponding numbers in Table 8.

TABLE 10

| | Coating layer | | | | | | |
|---|---|---|---|---|---|---|---|
| | Stack structure | | | | | | |
| | Layers X | | Layers Y | | Layers X + Layers Y | | |
| Sample No. | Composition | Average layer thickness (nm) | Composition | Average layer thickness (nm) | Average value of stacking periods T (nm) | Number of repetitions (times) | Total layer thickness (μm) |
| Comp. Prod. 3 | $(Al_{0.50}Ti_{0.50})N$ | 10 | $(Al_{0.60}Ti_{0.40})N$ | 10 | 20 | 200 | 4.0 |
| Comp. Prod. 4 | $(Al_{0.50}Ti_{0.50})CN$ | 10 | $(Al_{0.67}Ti_{0.33})CN$ | 10 | 20 | 200 | 4.0 |
| Comp. Prod. 5 | $(Al_{0.50}Ti_{0.50})N$ | 10 | $(Al_{0.45}Ti_{0.45}Si_{0.10})N$ | 10 | 20 | 200 | 4.0 |
| Comp. Prod. 6 | $(Al_{0.50}Ti_{0.50})N$ | 10 | $(Al_{0.45}Ti_{0.45}Sr_{0.10})N$ | 10 | 20 | 200 | 4.0 |
| Comp. Prod. 7 | $(Al_{0.50}Ti_{0.50})N$ | 10 | $(Al_{0.45}Ti_{0.45}Y_{0.10})N$ | 10 | 20 | 200 | 4.0 |
| Comp. Prod. 8 | $(Al_{0.50}Ti_{0.50})N$ | 10 | $(Al_{0.50}Ti_{0.30}Cr_{0.20})N$ | 10 | 20 | 200 | 4.0 |
| Comp. Prod. 9 | $(Al_{0.50}Ti_{0.50})N$ | 10 | $(Al_{0.50}Ti_{0.45}Nb_{0.05})N$ | 10 | 20 | 200 | 4.0 |
| Comp. Prod. 10 | $(Al_{0.50}Ti_{0.50})N$ | 10 | $(Al_{0.50}Ti_{0.45}Ta_{0.05})N$ | 10 | 20 | 200 | 4.0 |
| Comp. Prod. 11 | $(Al_{0.50}Ti_{0.50})N$ | 10 | $(Al_{0.50}Ti_{0.45}W_{0.05})N$ | 10 | 20 | 200 | 4.0 |
| Comp. Prod. 12 | $(Al_{0.50}Cr_{0.50})N$ | 10 | $(Al_{0.67}Ti_{0.33})N$ | 10 | 20 | 200 | 4.0 |
| Comp. Prod. 13 | $(Al_{0.50}Cr_{0.50})N$ | 10 | $(Ti_{0.90}Si_{0.10})N$ | 10 | 20 | 200 | 4.0 |
| Comp. Prod. 14 | $(Ti_{0.50}Cr_{0.50})N$ | 10 | $(Al_{0.67}Ti_{0.33})N$ | 10 | 20 | 200 | 4.0 |
| Comp. Prod. 15 | $(Ti_{0.50}Cr_{0.50})N$ | 10 | $(Ti_{0.90}Si_{0.10})N$ | 10 | 20 | 200 | 4.0 |

The respective layer thicknesses and the respective compositions of the layers in the samples obtained were determined in the same manner as in Example 1, the results being described in Tables 8 to 10. The compositional ratios of the metal elements in the layers described in Tables 8 and 10 indicate the atomic ratios of the metal elements relative to the total of the metal elements in the metal compounds forming the respective layers. The fracture resistance of the samples obtained was evaluated by using the samples in face milling under the same test conditions as in Example 1. The evaluation results are described in Tables 11 and 12.

TABLE 11

| Sample No. | Length of cutting (m) |
|---|---|
| Inventive Product 23 | 9.1 |
| Inventive Product 24 | 8.8 |
| Inventive Product 25 | 8.8 |
| Inventive Product 26 | 8.7 |
| Inventive Product 27 | 8.8 |
| Inventive Product 28 | 9.0 |
| Inventive Product 29 | 8.8 |
| Inventive Product 30 | 8.8 |
| Inventive Product 31 | 9.0 |
| Inventive Product 32 | 9.0 |
| Inventive Product 33 | 8.6 |
| Inventive Product 34 | 9.0 |
| Inventive Product 35 | 8.6 |

TABLE 12

| Sample No. | Length of cutting (m) |
|---|---|
| Comparative Product 3 | 3.5 |
| Comparative Product 4 | 3.3 |
| Comparative Product 5 | 3.3 |
| Comparative Product 6 | 3.1 |
| Comparative Product 7 | 3.2 |
| Comparative Product 8 | 3.4 |
| Comparative Product 9 | 3.3 |
| Comparative Product 10 | 3.3 |
| Comparative Product 11 | 3.4 |
| Comparative Product 12 | 3.4 |
| Comparative Product 13 | 3.0 |
| Comparative Product 14 | 3.4 |
| Comparative Product 15 | 3.0 |

From Tables 11 and 12, it has been shown that Inventive Products achieved a longer length of cutting and had a longer tool life than Comparative Products which had an alternate stack structure composed of layers with various uniform layer thicknesses.

REFERENCE SIGNS LIST

1 Substrate
2 Coating layer
3 First stack structure
4 Second stack structure
5 Layer A1
6 Layer B1
7 Layer A2
8 Layer B2

What is claimed is:

1. A coated tool, comprising:
a substrate and a coating layer disposed on a surface of the substrate, the coating layer including a first stack structure and a second stack structure,
the first stack structure having a structure in which two or more kinds of layers with different compositions are periodically stacked, wherein the average layer thickness of each of the layers is 60 nm to 500 nm,
the second stack structure having a structure in which two or more kinds of layers with different compositions are periodically stacked, wherein the average layer thickness of each of the layers is 2 nm to less than 60 nm,
the layers constituting the first stack structure and the layers constituting the second stack structure including at least one selected from the compounds including at least one metal element selected from Ti, Nb, Ta, Cr, W, Al, Si, Sr and Y and at least one non-metal element selected from carbon and nitrogen,
wherein the first stack structure is an alternate stack structure including two kinds of layers with different compositions stacked alternately each in two or more layers, and
wherein the coating layer includes a structure including the first stack structures and the second stack structures stacked alternately and continuously each in two or more structures.

2. The coated tool according to claim 1, wherein the second stack structure is an alternate stack structure including two kinds of layers with different compositions stacked alternately each in two or more layers.

3. The coated tool according to claim 1, wherein $(T_1-T_2)$ is 20 nm to 996 nm,
wherein $T_1$ is the average value of the stacking periods in the first stack structure and $T_2$ is the average value of the stacking periods in the second stack structure.

4. The coated tool according to claim 1, wherein
the metal elements present in the layers constituting the first stack structure are identical among the layers constituting the first stack structure and include one or more metal elements having a difference in absolute value of 5 at % or more between the ratio thereof relative to the total of the metal elements present in one layer constituting the first stack structure and the ratio of the identical metal element relative to the total of the metal elements present in a layer constituting the first stack structure which layer is adjacent to the one layer.

5. The coated tool according to claim 1, wherein
the metal elements present in the layers constituting the second stack structure are identical among the layers constituting the second stack structure and include one or more metal elements having a difference in absolute value of 5 at % or more between the ratio thereof relative to the total of the metal elements present in one layer constituting the second stack structure and the ratio of the identical metal element relative to the total of the metal elements present in a layer constituting the second stack structure which layer is adjacent to the one layer.

6. The coated tool according to claim 1, wherein one layer constituting the first stack structure contains one or more metal elements different from the metal element or elements present in a layer constituting the first stack structure which layer is adjacent to the one layer.

7. The coated tool according to claim 1, wherein one layer constituting the second stack structure contains one or more metal elements different from the metal element or elements present in a layer constituting the second stack structure which layer is adjacent to the one layer.

8. The coated tool according to claim 1, wherein the average total layer thickness of the entirety of the coating layer is 0.22 to 12 μm.

9. The coated tool according to claim 1, wherein the average thickness of the first stack structure is 0.2 to 6 μm.

10. The coated tool according to claim 1, wherein the average thickness of the second stack structure is 0.02 to 6 μm.

* * * * *